United States Patent
Kim et al.

(10) Patent No.: US 12,080,619 B2
(45) Date of Patent: Sep. 3, 2024

(54) SEMICONDUCTOR PACKAGE

(71) Applicant: SAMSUNG ELECTRONICS CO., LTD., Suwon-si (KR)

(72) Inventors: Sang-Uk Kim, Cheonan-si (KR); Ki Wook Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 318 days.

(21) Appl. No.: 17/723,347

(22) Filed: Apr. 18, 2022

(65) Prior Publication Data

US 2023/0090461 A1 Mar. 23, 2023

(30) Foreign Application Priority Data

Sep. 17, 2021 (KR) .................. 10-2021-0124558

(51) Int. Cl.

| | |
|---|---|
| *H01L 23/373* | (2006.01) |
| *H01L 23/367* | (2006.01) |
| *H01L 23/538* | (2006.01) |
| *H01L 25/18* | (2023.01) |
| *H01L 49/02* | (2006.01) |

(52) U.S. Cl.
CPC .......... *H01L 23/373* (2013.01); *H01L 23/367* (2013.01); *H01L 23/5385* (2013.01); *H01L 25/18* (2013.01); *H01L 28/40* (2013.01)

(58) Field of Classification Search
CPC . H01L 23/373; H01L 23/367; H01L 23/5385; H01L 25/18; H01L 28/40
See application file for complete search history.

(56) References Cited

U.S. PATENT DOCUMENTS

| | | | |
|---|---|---|---|
| 6,433,412 B2* | 8/2002 | Ando | .............. H01L 21/563 257/730 |
| 8,796,072 B2 | 8/2014 | Kelly et al. | |
| 9,960,099 B2 | 5/2018 | Tseng et al. | |
| 10,685,854 B2 | 6/2020 | Hung | |
| 2016/0307872 A1* | 10/2016 | Chen | .............. H01L 21/4857 |
| 2019/0214328 A1 | 7/2019 | Eid et al. | |
| 2020/0161275 A1 | 5/2020 | Lin et al. | |
| 2020/0335480 A1 | 10/2020 | Hwang et al. | |
| 2021/0193544 A1 | 6/2021 | Lin et al. | |

* cited by examiner

*Primary Examiner* — Peniel M Gumedzoe
(74) *Attorney, Agent, or Firm* — F. CHAU & ASSOCIATES, LLC

(57) ABSTRACT

A semiconductor package includes: a substrate; a first semiconductor chip disposed on the substrate; a capacitor disposed on the substrate and spaced apart from the first semiconductor chip in a first direction; an insulating layer disposed on the substrate and covering the capacitor; a first heat conductive layer at least partially surrounding side walls of the first semiconductor chip and disposed on the insulating layer, wherein the first heat conductive layer is in contact with the side walls of the first semiconductor chip, and wherein the first heat conductive layer includes a first material that is a conductive material; and a second heat conductive layer disposed on the first heat conductive layer, wherein the second heat conductive layer is in contact with the first heat conductive layer, wherein the second heat conductive layer includes a second material that is a non-conductive material.

20 Claims, 12 Drawing Sheets

FIG. 1
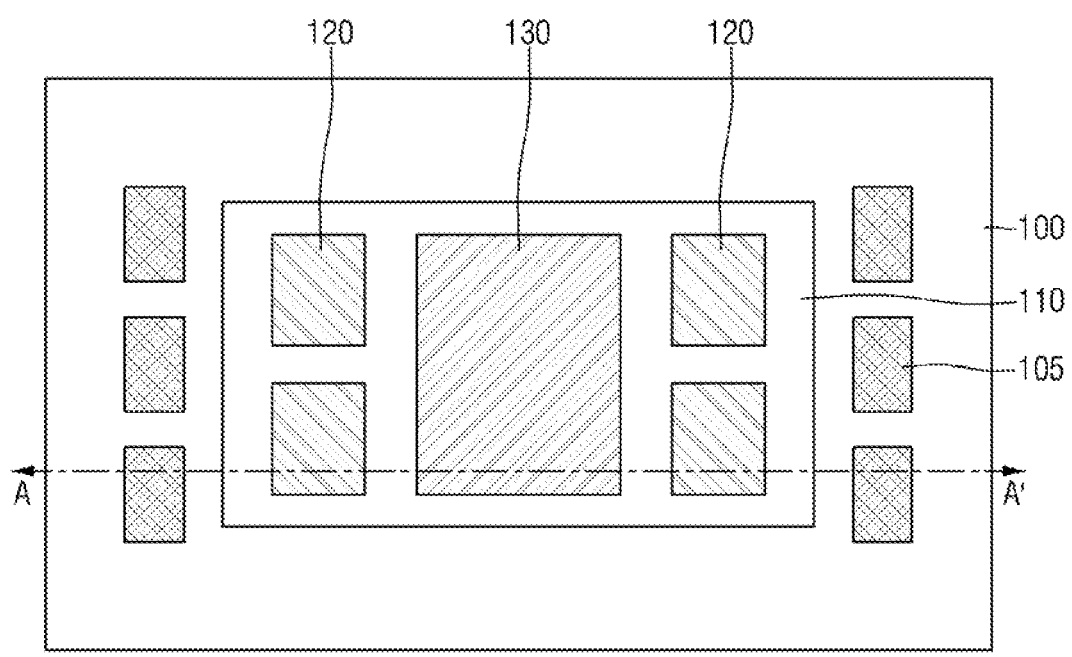
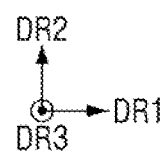

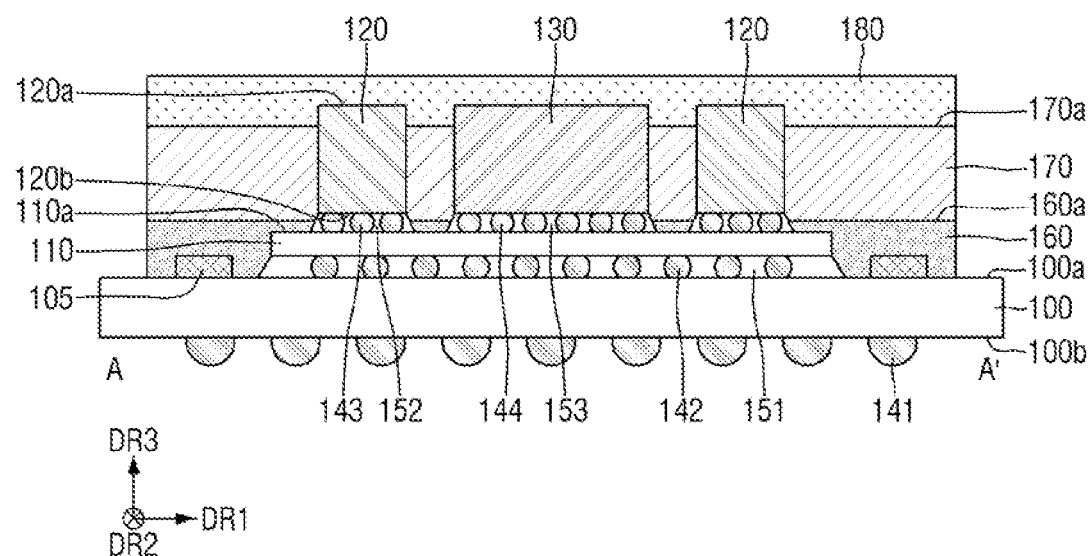
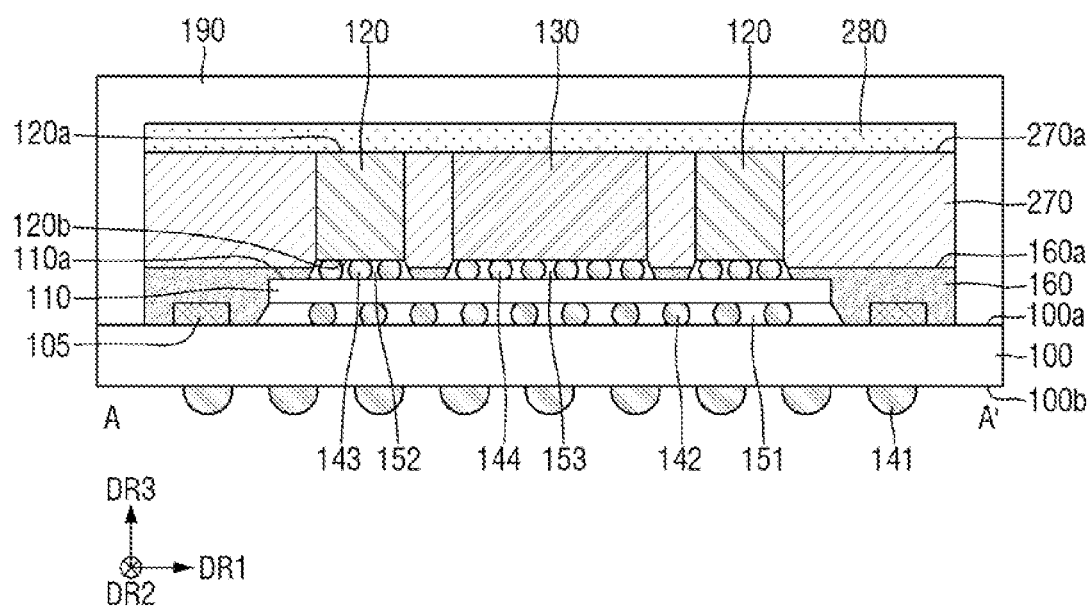

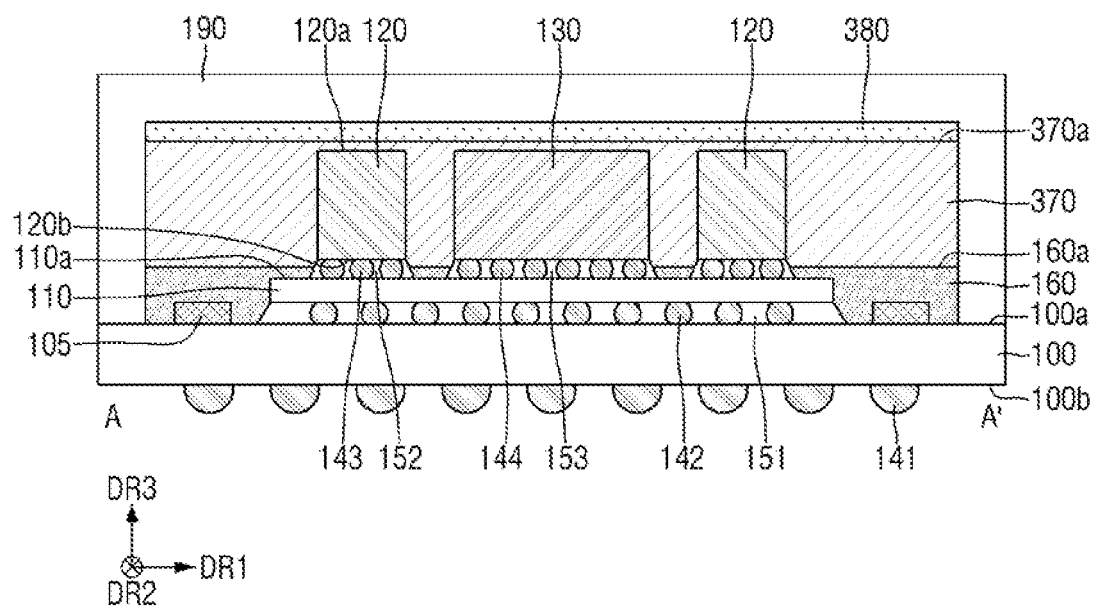
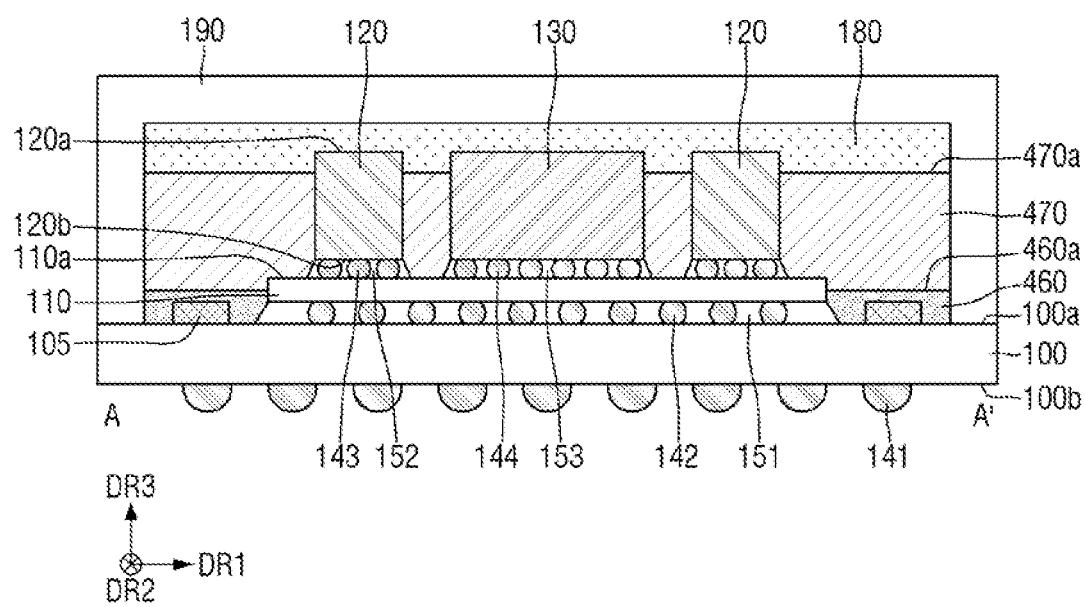

FIG. 16
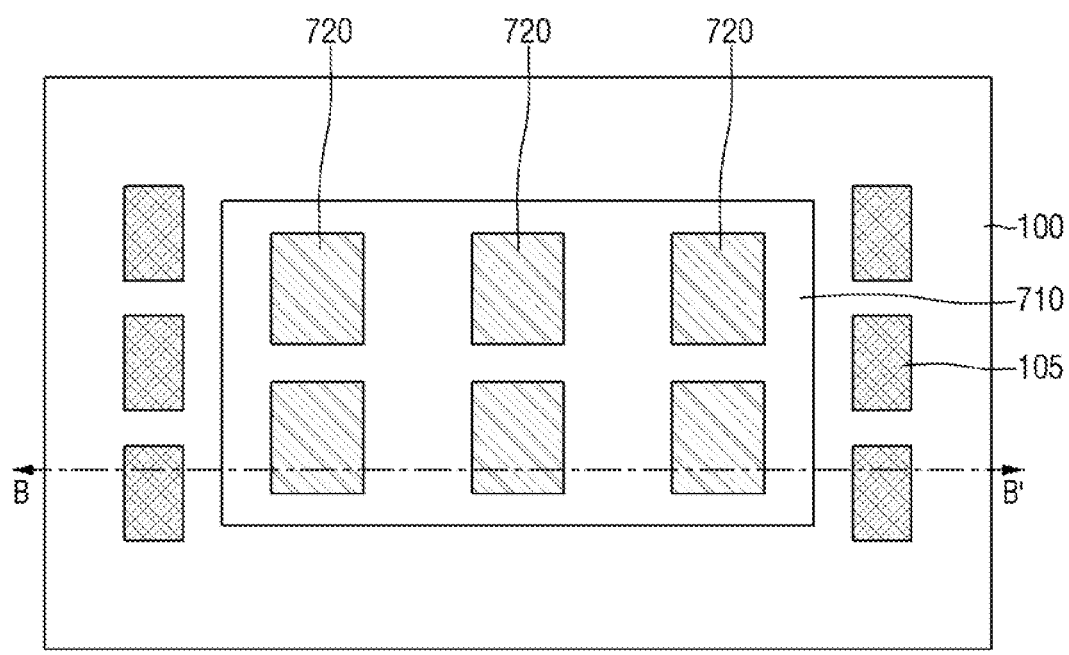
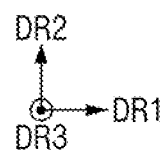

SEMICONDUCTOR PACKAGE

CROSS-REFERENCE TO RELATED APPLICATION

This application claims priority under 35 U.S.C. § 119 to Korean Patent Application No. 10-2021-0124558 filed on Sep. 17, 2021 in the Korean Intellectual Property Office, the disclosure of which is incorporated by reference herein in its entirety.

TECHNICAL FIELD

The present inventive concept relates to a semiconductor package.

DISCUSSION OF THE RELATED ART

In recent years, as implementation of high-performance devices has been desired, the size of semiconductor chips has increased, and therefore the size of semiconductor packages has increased. In addition, the thickness of the semiconductor package has decreased due to the reduced thickness of the electronic device in which they are used.

In addition, the semiconductor packages are currently under development to satisfy the demands for multi-functionality, high capacity, and miniaturization in the electronic industry. For this reason, by incorporating a plurality of semiconductor chips into a single semiconductor package, it has become possible to perform high capacity and multiple functions, while reducing the size of the semiconductor package.

SUMMARY

According to an exemplary embodiment of the present inventive concept, a semiconductor package includes: a substrate; a first semiconductor chip disposed on the substrate; a capacitor disposed on the substrate and spaced apart from the first semiconductor chip in a first direction; an insulating layer disposed on the substrate and covering the capacitor; a first heat conductive layer at least partially surrounding side walls of the first semiconductor chip and disposed on the insulating layer, wherein the first heat conductive layer is in contact with the side walls of the first semiconductor chip, and wherein the first heat conductive layer includes a first material that is a conductive material; and a second heat conductive layer disposed on the first heat conductive layer, wherein the second heat conductive layer is in contact with the first heat conductive layer, wherein the second heat conductive layer includes a second material that is a non-conductive material.

According to an exemplary embodiment of the present inventive concept, a semiconductor package includes: a substrate; an interposer disposed on the substrate; a first semiconductor chip disposed on an interposer, and electrically connected to the interposer; an insulating layer disposed on the substrate, in contact with at least parts of side walls of the interposer; a first heat conductive layer surrounding side walls of the first semiconductor chip and disposed on the insulating layer, wherein the first heat conductive layer is in contact with the side walls of the first semiconductor chip, wherein the first heat conductive layer includes a first material that is a conductive material, and wherein a lower surface of the first heat conductive layer is formed to be lower than a lower surface of the first semiconductor chip, with respect to an upper surface of the substrate; and a second heat conductive layer disposed on the first heat conductive layer, and in contact with each of the first heat conductive layer and the first semiconductor chip, and wherein the second heat conductive layer includes a second material that is a non-conductive material.

According to an exemplary embodiment of the present inventive concept, a semiconductor package includes: a substrate; an interposer disposed on the substrate; a first semiconductor chip disposed on an interposer, and electrically connected to the interposer; a second semiconductor chip disposed on the interposer and spaced apart from the first semiconductor chip in a horizontal direction, wherein the second semiconductor chip is electrically connected to the interposer; a capacitor disposed on the substrate and spaced apart from the interposer in the horizontal direction, an insulating layer covering the capacitor; a first heat conductive layer disposed on the insulating layer and surrounding side walls of the first semiconductor chip, wherein the first heat conductive layer is in contact with the side walls of the first semiconductor chip, wherein the first heat conductive layer includes a first material that is a conductive material, and wherein a lower surface of the first heat conductive layer is lower than a lower surface of the first semiconductor chip, with respect to an upper surface of the substrate; a second heat conductive layer disposed on the first heat conductive layer, and in contact with each of the first heat conductive layer, the first semiconductor chip and the second semiconductor chip, and wherein the second heat conductive layer includes a second material that is a non-conductive material; and a heat sink covering the insulating layer, the first heat conductive layer, and the second heat conductive layer, wherein the heat sink is in contact with side walls of the first heat conductive layer, and wherein a thermal conductivity of the first material is greater than a thermal conductivity of the second material.

BRIEF DESCRIPTION OF THE DRAWINGS

The above and other features of the present inventive concept will become more apparent by describing in detail exemplary embodiments thereof with reference to the attached drawings, in which:

FIG. 1 is a plan view illustrating a semiconductor package according to an exemplary embodiment of the present inventive concept;

FIGS. 3, 4, 5 and 6 are intermediate stage diagrams illustrating a method for fabricating a semiconductor package according to an exemplary embodiment of the present inventive concept;

FIG. 7 is cross-sectional view illustrating a semiconductor package according to an exemplary embodiment of the present inventive concept;

FIG. 8 is cross-sectional view illustrating a semiconductor package according to an exemplary embodiment of the present inventive concept:

FIG. 9 is cross-sectional view illustrating a semiconductor package according to an exemplary embodiment of the present inventive concept:

FIG. 16 is a plan view illustrating a semiconductor package according to an exemplary embodiment of the present inventive concept;

DETAILED DESCRIPTION OF THE EMBODIMENTS

Hereinafter, a semiconductor package according to an exemplary embodiment of the present inventive concept will be described reference to FIGS. 1 and 2.

FIG. 1 is a plan view illustrating a semiconductor package according to an exemplary embodiment of the present inventive concept. FIG. 2 is a cross-sectional view taken along a line A-A' of FIG. 1.

Figure 2:
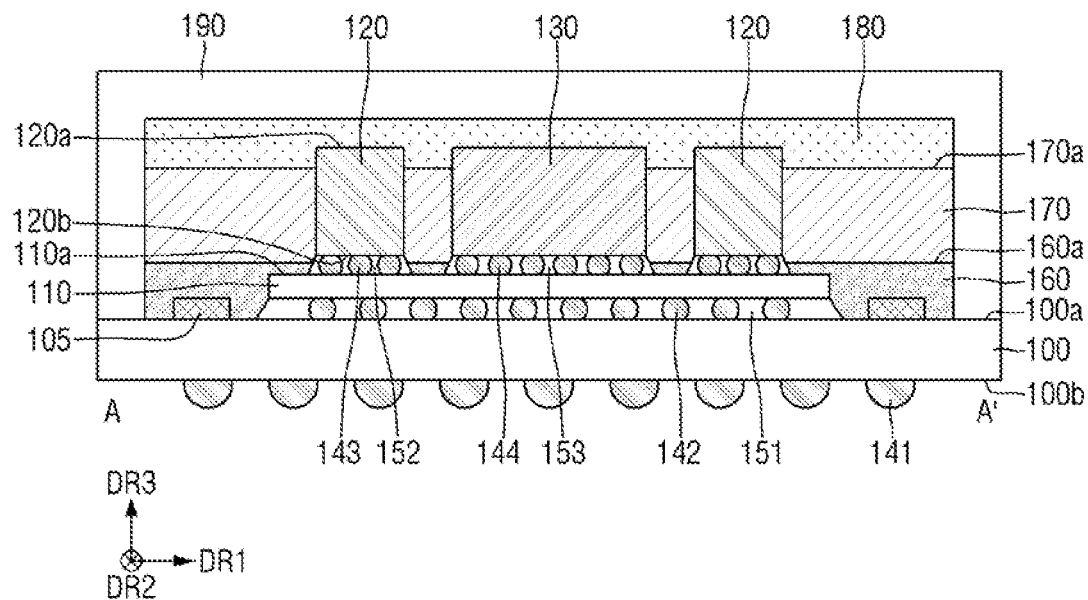
FIG. 2 is a cross-sectional view taken along a line A-A' of FIG. 1.

Referring to FIGS. 1 and 2, the semiconductor package according an exemplary embodiment of the present inventive concept includes a substrate 100, a capacitor 105, an interposer 110, a first semiconductor chip 120, a second semiconductor chip 130, first to fourth solder balls 141, 142, 143 and 144, first to third underfill materials 151, 152 and 153, an insulating layer 160, a first heat conductive layer 170, a second heat conductive layer 180, and a heat sink 190.

The substrate 100 may be, for example, a printed circuit board (PCB) or a ceramic substrate. However, the present inventive concept is not limited thereto.

When the substrate 100 is a printed circuit board, the substrate 100 may be made of at least one of phenolic resin, epoxy resin, and/or polyimide. For example, the substrate 100 may include at least one of FR-4, tetrafunctional epoxy, polyphenylene ether, epoxy/polyphenylene oxide, BT (bismaleimide triazine), the mount, cyanate ester, polyimide, and/or liquid crystal polymer. The surface of the substrate 100 may be covered with a solder resist, but the present inventive concept is not limited thereto.

A first solder ball 141 may be disposed on a lower surface 100b of the substrate 100. The first solder ball 141 may be in contact with conductive terminals disposed on the lower surface 100b of the substrate 100. The first solder ball 141 may protrude convexly from the lower surface 100b of the substrate 100. The first solder ball 141 may be connected to the substrate 100 and may be electrically connected to another external element.

Although the first solder ball 141 may include, for example, at least one of tin (Sn), indium (in), lead (Pb), zinc (Zn), nickel (Ni), gold (Au), silver (Ag), copper (Cu), antimony (Sb), bismuth (Bi), and combinations thereof, the present inventive concept is not limited thereto.

An interposer 110 may be disposed on the substrate 100. For example, the interposer 110 may be disposed on an upper surface 100a of the substrate 100. The interposer 110 may include, for example, silicon. In an exemplary embodiment of the present inventive concept, the interposer 110 may include, for example, at least one of glass, ceramic and/or plastic, but the present inventive concept is not limited thereto.

A plurality of wirings and a plurality of vias may be disposed inside the interposer 110. For example, the plurality of wirings may include wirings that are spaced apart from each other and disposed at different levels from each other. Each of the plurality of vias may connect a plurality of wirings, which are disposed at different levels from each other, to each other.

A second solder ball 142 may be disposed between the upper surface 100a of the substrate 100 and the interposer 110. For example, the second solder ball 142 may be in contact with the conductive terminal disposed on the upper surface 100a of the substrate 100. For example, the second solder ball 142 may be in contact with the conductive terminal disposed on the lower surface of the interposer 110. For example, the interposer 110 may be electrically connected to the substrate 100 through the second solder ball 142. However, the present inventive concept is not limited thereto. For example, the interposer 110 may be directly electrically connected to the substrate 100.

Although the second solder ball 142 may include, for example, at least one of tin (Sn), indium (in), lead (Pb), zinc (Zn), nickel (Ni), gold (Au), silver (Ag), copper (Cu), antimony (Sb), bismuth (Bi), and combinations thereof, the present inventive concept is not limited thereto.

A first underfill material 151 may be disposed on the side walls of the second solder ball 142 and between the upper surface 100a of the substrate 100 and the lower surface of the interposer 110. For example, the first underfill material 151 may at least partially surround the second solder ball 142. The first underfill material 151 may be formed to protrude laterally from the side walls of the interposer 110, but the present inventive is not limited thereto.

The capacitor 105 may be disposed on the substrate 100. For example, the capacitor 105 may be disposed on the upper surface 100a of the substrate 100. For example, a plurality of capacitors 105 may be disposed on the edge of the substrate 100. Although FIG. 1 shows that six capacitors 105 are disposed on the upper surface 100a of the substrate 100, the number of capacitors 105 disposed on the upper surface 100a of the substrate 100 is not limited thereto. The capacitor 105 may be directly electrically connected to the substrate 100.

The first semiconductor chip 120 may be disposed on the interposer 110. For example, the first semiconductor chip 120 may be disposed on the upper surface 110a of the interposer 110. A plurality of the first semiconductor chips 120 may be disposed on the upper surface 110a of the interposer 110 and may be spaced apart from each other in a first horizontal direction DR1 and a second horizontal direction DR1 different from the first horizontal direction DR1. Although FIG. 1 shows that four first semiconductor chips 120 are disposed on the upper surface 110a of the interposer 110, the number of first semiconductor chips 120 disposed on the upper surface 110a of the interposer 110 is not limited thereto.

For example, the first semiconductor chip 120 may be an HBM semiconductor chip. For example, the first semiconductor chip 120 may include a plurality of stacked memory semiconductor chips. Each of the plurality of memory semiconductor chips may be a volatile memory semiconductor chip such as a DRAM (Dynamic Random Access Memory) or a SRAM (Static Random Access Memory), or a non-volatile memory semiconductor chip such as PRAM (Phase-change Random Access Memory), a MRAM (Magnetoresistive Random Access Memory), a FeRAM (Ferroelectric Random Access Memory) or a RRAM (Resistive Random Access Memory). However, the present inventive concept is not limited thereto.

A third solder ball 143 may be disposed between the upper surface 110a of the interposer 110 and the first semiconductor chip 120. The third solder ball 143 may be in contact with the conductive terminal disposed on the upper surface 110a of the interposer 110. The third solder ball 143 may be in contact with the conductive terminal disposed on the lower surface 120b of the first semiconductor chip 120. The first semiconductor chip 120 may be electrically connected to the interposer 110 through the third solder ball 143.

Although the third solder ball 143 may include, for example, at least one of tin (Sn), indium (In), lead (Pb), zinc (Zn), nickel (Ni), gold (Au), silver (Ag), copper (Cu), antimony (Sb), bismuth (Bi), and combinations thereof, the present inventive concept is not limited thereto.

A second underfill material 152 may be disposed on the side walls of the third solder ball 143 and between the upper surface 110a of the interposer 110 and the lower surface 120b of the first semiconductor chip 120. For example, the second underfill material 152 may at least partially surround the third solder balls 143. The second underfill material 152 may be formed to protrude laterally from the side walls of the first semiconductor chip 120, but the present inventive concept is not limited thereto.

The second semiconductor chip 130 may be disposed on the interposer 110. For example, the second semiconductor chip 130 may be disposed on the upper surface 110a of the interposer 110. The second semiconductor chip 130 may be spaced apart from the first semiconductor chip 120 in the first horizontal direction DR1. The second semiconductor chip 130 may be, for example, a logic semiconductor chip. The second semiconductor chip 130 may be, for example, a micro-processor. The second semiconductor chip 130 may be, for example, a central processing unit (CPU), a controller, an application specific integrated circuit (ASIC) or the like.

A fourth solder ball 144 may be disposed between the upper surface 110a of the interposer 110 and the second semiconductor chip 130. The fourth solder ball 144 may be in contact with the conductive terminal disposed on the upper surface 110a of the interposer 110. The fourth solder ball 144 may be in contact with the conductive terminal disposed on the lower surface of the second semiconductor chip 130. The second semiconductor chip 130 may be electrically connected to the interposer 110 through the fourth solder ball 144.

Although the fourth solder ball 144 may include, for example, at least one of tin (Sn), indium (in), lead (Pb), zinc (Zn), nickel (Ni), gold (Au), silver (Ag), copper (Cu), antimony (Sb), bismuth (Bi), and combinations thereof, the present inventive concept is not limited thereto.

A third underfill material 153 may be disposed on the side walls of the fourth solder ball 144 and between the upper surface 110a of the interposer 110 and the lower surface of the second semiconductor chip 130. For example, the third underfill material 153 may at least partially surround the fourth solder ball 144. The third underfill material 153 may be formed to protrude laterally from the side walls of the second semiconductor chip 130, but the present inventive concept is not limited thereto.

The insulating layer 160 may be disposed on the substrate 100. For example, the insulating layer 160 may be disposed on the upper surface 100a of the substrate 100. The insulating layer 160 may cover the capacitor 105. The insulating layer 160 may be disposed on the side walls and the upper surface of the capacitor 105. An upper surface 160a of the insulating layer 160 may be formed to be higher than the upper surface of the capacitor 105. The upper surface 160a of the insulating layer 160 may be formed to be higher than the upper surface 110a of the interposer 110. The upper surface 160a of the insulating layer 160 may be formed to be lower than each of the lower surface 120b of the first semiconductor chip 120 and the lower surface of the second semiconductor chip 130.

The insulating layer 160 may at least partially surround the side walls of the first underfill material 151 that is disposed on the upper surface 100a of the substrate 100. The insulating layer 160 may be in contact with at least a part of the side walls of the interposer 110. The insulating layer 160 may electrically insulate the capacitor 105 from each of the interposer 110, the first semiconductor chip 120, and the second semiconductor chip 130. Further, the insulating layer 160 may electrically insulate the capacitor 105 from a first heat conductive layer 170 to be described below. The insulating layer 160 may at least partially surround each of at least a part of the side walls of the second underfill material 152 and at least a part of the side walls of the third underfill material 153, on the upper surface 110a of the interposer 110. However, the present inventive concept is not limited thereto.

The insulating layer 160 may include an insulating material. The insulating layer 160 may include, for example, an epoxy molding compound (EMC) or two or more types of silicone hybrid materials. However, the present inventive concept is not limited thereto.

The first heat conductive layer 170 may be disposed on the insulating layer 160. The first heat conductive layer 170 may at least partially surround each of the side walls of the first semiconductor chip 120 and the side walls of the second semiconductor chip 130. For example, the first heat conductive layer 170 may be in contact with each of the side walls of the first semiconductor chip 120 and the side walls of the second semiconductor chip 130. The first heat conductive layer 170 may be spaced apart from the capacitor 105 in the vertical direction DR3. The first heat conductive layer 170 may be electrically insulated from the capacitor 105.

The lower surface of the first heat conductive layer 170 may be formed to be higher than the upper surface 110a of the interposer 110. The lower surface of the first heat conductive layer 170 may be formed to be lower than the lower surface of the first semiconductor chip 120. Further, the lower surface of the first heat conductive layer 170 may be formed to be lower than the lower surface of the second semiconductor chip 130. An upper surface 170a of the first heat conductive layer 170 may be formed to be lower than the upper surface 120a of the first semiconductor chip 120. The upper surface 170a of the first heat conductive layer 170 may be formed to be lower than the upper surface of the second semiconductor chip 130.

The first heat conductive layer 170 may include a first material that is a conductive material. The first material may include, for example, silver (Ag). However, the present inventive concept is not limited thereto. For example, the first material may include other conductive materials.

The second heat conductive layer 180 may be disposed on the first heat conductive layer 170. The second heat conductive layer 180 may at least partially surround the side walls and the upper surface 120a of the first semiconductor chip 120. The second heat conductive layer 180 may at least partially surround the side walls and the upper surface of the second semiconductor chip 130. For example, the second heat conductive layer 180 may be in contact with the first heat conductive layer 170. The second heat conductive layer 180 may be disposed on each of the side walls and the upper surface of the first semiconductor chip 120. For example, the second heat conductive layer 180 may be in contact with each of the side walls and the upper surface of the first semiconductor chip 120. The second heat conductive layer 180 may be disposed on each of the side walls and the upper surface of the second semiconductor chip 130. For example, the second heat conductive layer 18) may be in contact with each of the side walls and the upper surface of the second semiconductor chip 130.

The lower surface of the second heat conductive layer 180 may be formed to be lower than each of the upper surface 120a of the first semiconductor chip 120 and the upper surface of the second semiconductor chip 130. The upper surface of the second heat conductive layer 180 may be formed to be higher than each of the upper surface 120a of the first semiconductor chip 120 and the upper surface of the second semiconductor chip 130.

The second heat conductive layer 180 may include a second material which is a non-conductive material. The second material may include, for example, at least one of a silicon-based material, a thermosetting material, a thermoplastic material, and/or a UV-treated material. In addition, the second material may include, for example, a polymer such as a resin.

A thermal conductivity of the first thermal conductive layer 170 may be greater than a thermal conductivity of the second thermal conductive layer 180. The thermal conductivity of the first material included in the first heat conductive layer 170 may be greater than the thermal conductivity of the second material included in the second heat conductive layer 180. Further, for example, the thermal conductivity of the first material may have a range of about 7 W/m-k to about 13 W/m-k. For example, the thermal conductivity of the second material may have a range of about 2 W/m-k to about 5 W/m-k.

The Young's modulus of the first heat conductive layer 170 may be smaller than the Young's modulus of the second heat conductive layer 180. The Young's modulus of the first material included in the first heat conductive layer 170 may be smaller than the Young's modulus of the second material included in the second heat conductive layer 180. For example, a strain rate of the first heat conductive layer 170 due to stress may be smaller than the strain rate of the second heat conductive layer 180 due to stress. For example, the Young's modulus of the first material may be about 15 MPa to about 30 MPa at about room temperature. Further, for example, the Young's modulus of the second material may be about 70 MPa to about 130 MPa at about room temperature.

An elongation of the first heat conductive layer 170 may be smaller than an elongation of the second heat conductive layer 180. The elongation of the first material included in the first heat conductive layer 170 may be smaller than the elongation of the second material included in the second heat conductive layer 180. Here, the elongation may be a stretched ratio of a test piece until the test piece breaks in the tensile test. For example, the elongation of the first material may be about 5% to about 20%. Further, for example, the elongation of the second material may be about 40% to about 70%.

The heat sink 190 may be disposed on the upper surface 100a of the substrate 100. The heat sink 190 may be disposed to cover each of the insulating layer 160, the first heat conductive layer 170, and the second heat conductive layer 180. For example, the heat sink 190 may be in contact with each of the upper surface 100a of the substrate 100, the side walls of the insulating layer 160, the side walls of the first heat conductive layer 170, and the side walls and the upper surface of the second heat conductive layer 180.

In the semiconductor package according to an exemplary embodiment of the present inventive concept, by disposing the first heat conductive layer 170, which includes the conductive material having high thermal conductivity, to be in contact with the side walls of each of the first and second semiconductor chips 120 and 130, and to at least partially surround the side walls of each of the first and second semiconductor chips 120 and 130, the heat generated from each of the first and second semiconductor chips 120 and 130 can be released to the outside of the semiconductor package.

Further, in the semiconductor package according to an exemplary embodiment of the present inventive concept, by disposing the second heat conductive layer 180, which includes a non-conductive material having the relatively high Young's modulus and the relatively high elongation, on the first heat conductive layer 170, the heat sink 190 can be prevented from being peeled off from the second heat conductive layer 180.

Hereinafter, a method for fabricating a semiconductor package according to an exemplary embodiment of the present inventive concept will be described with reference to FIGS. 2 to 6.

FIGS. 3 to 6 are intermediate stage diagrams illustrating a method for fabricating a semiconductor package according to an exemplary embodiment of the present inventive concept.

Figure 3:
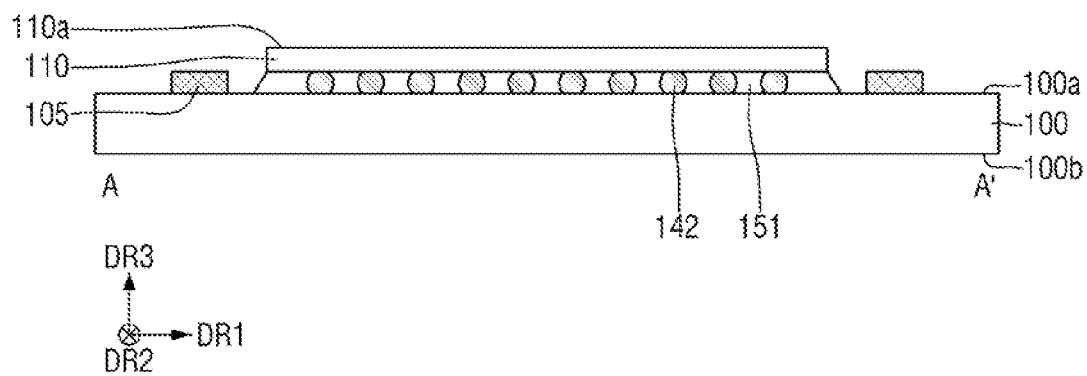

Referring to FIG. 3, the interposer 110 may be formed on the upper surface 100a of the substrate 100. The interposer 110 may be connected to the upper surface 100a of the substrate 100 through the second solder ball 142. Subsequently, the first underfill material 151 may be formed between the upper surface 100a of the substrate 100 and the interposer 110 to at least partially surround the side walls of the second solder ball 142. Subsequently, a plurality of capacitors 105 may be formed on the edge of the upper surface 100a of the substrate 100. The plurality of capacitors 105 may be spaced apart from the first underfill material 151.

In an exemplary embodiment of the present inventive concept, the interposer 110 may be formed on the upper surface 100a of the substrate 100 after the plurality of capacitors 105 are formed on the edge of the upper surface 100a of the substrate 100.

Figure 4:
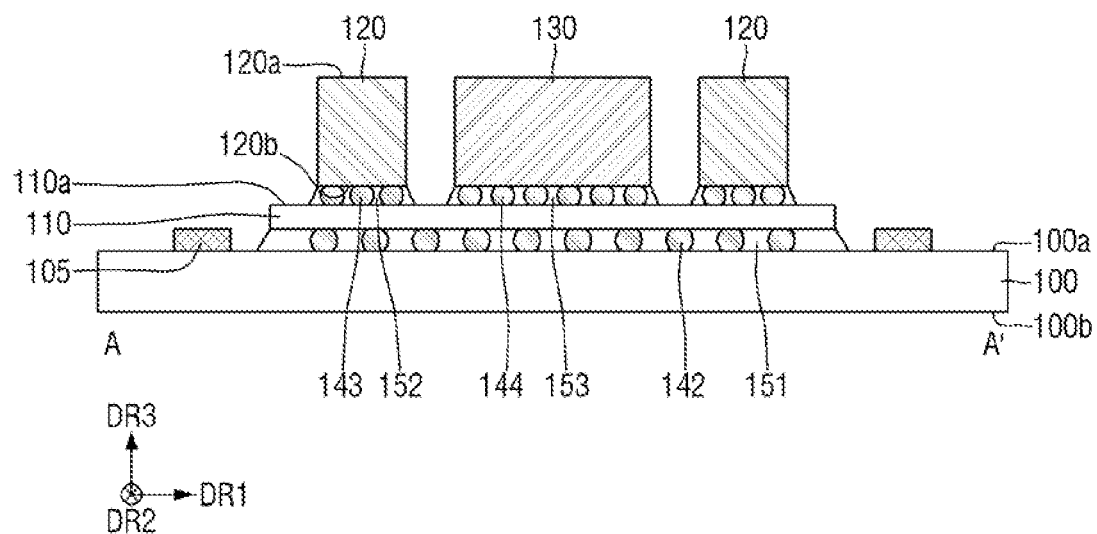

Referring to FIG. 4, the first semiconductor chip 120 and the second semiconductor chip 130 may be formed on the upper surface 110a of the interposer 110. The first semiconductor chip 120 may be connected to the upper surface 110a of the interposer 110 through the third solder ball 143. Further, the second semiconductor chip 130 may be connected to the upper surface 110a of the interposer 110 through the fourth solder ball 144.

Next, the second underfill material 152 may be formed to at least partially surround the side walls of the third solder ball 143 between the upper surface 110a of the interposer 110 and the first semiconductor chip 120. Further, the third underfill material 153 may be formed to at least partially surround the side walls of the fourth solder ball 144 between the upper surface 1100a of the interposer 110 and the second semiconductor chip 130.

Figure 5:
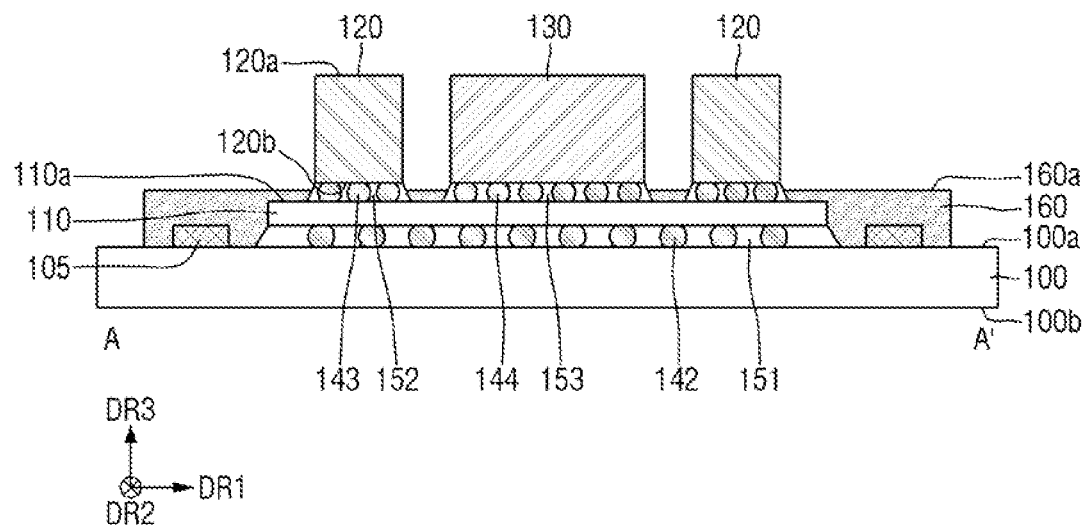

Referring to FIG. 5, the insulating layer 160 may be formed on the upper surface 100a of the substrate 100 to cover the plurality of capacitors 105. For example, the upper surface 160a of the insulating layer 160 may be formed to be higher than the upper surface 110a of the interposer 110. Further, for example, the upper surface 160a of the insulating layer 160 may be formed to be lower than each of the lower surface 120b of the first semiconductor chip 120 and the lower surface of the second semiconductor chip 130. The insulating layer 160 may at least partially surround each of at least a part of the side walls of the second underfill material 152 and at least a part of the side walls of the third underfill material 153, on the upper surface 110a of the interposer 110. For example, the insulating layer 160 may completely surround each of the side walls of the second underfill material 152 and the side walls of the third underfill material 153.

Referring to FIG. 6, the first heat conductive layer 170 may be formed on the upper surface 160a of the insulating layer 160. The first heat conductive layer 170 may at least partially surround each of a part of the side walls of the first semiconductor chip 120 and a part of the side walls of the second semiconductor chip 130. For example, the first heat conductive layer 170 may be in contact with each of a part of the side walls of the first semiconductor chip 120 and a part of the side walls of the second semiconductor chip 130. For example, the upper surface 170a of the first heat conductive layer 170 may be formed to be lower than each of the upper surface 120a of the first semiconductor chip 120 and the upper surface of the second semiconductor chip 130.

Subsequently, the second heat conductive layer 180 may be formed on the upper surface 170a of the first heat conductive layer 170. The second heat conductive layer 180 may at least partially surround each of a part of the side walls of the first semiconductor chip 120 and a part of the side walls of the second semiconductor chip 130. Further, the second heat conductive layer 180 may cover each of the upper surface 120a of the first semiconductor chip 120 and the upper surface of the second semiconductor chip 130.

Although FIG. 6 shows that each of the side walls of the insulating layer 160, the side walls of the first heat conductive layer 170, and the side walls of the second heat conductive layer 180 are aligned in the vertical direction DR3, the present inventive concept is not limited thereto.

Referring to FIG. 2, the heat sink 190 may be formed on the upper surface 100a of the substrate 100. The heat sink 190 may cover each of the insulating layer 160, the first heat conductive layer 170, and the second heat conductive layer 180. For example, the heat sink 190 may be in contact with each of the upper surface 100a of the substrate 100, the side walls of the insulating layer 160, the side walls of the first heat conductive layer 170, and the side walls and the upper surface of the second heat conductive layer 180. The semiconductor package shown in FIG. 2 may be fabricated through such a fabricating process.

Hereinafter, a semiconductor package according to an exemplary embodiment of the present inventive concept will be described with reference to FIG. 7. Differences from the semiconductor package shown in FIGS. 1 and 2 will be mainly described. In addition, to the extent that the description of various elements are omitted, it may be assumed that these elements are at least similar to corresponding elements that have already been described.

FIG. 7 is cross-sectional view illustrating a semiconductor package according to an exemplary embodiment of the present inventive concept.

Referring to FIG. 7, in the semiconductor package according to an exemplary embodiment of the present inventive concept, an upper surface 270a of a first heat conductive layer 270 may be formed on the same plane as the upper surface 120a of the first semiconductor chip 120. Further, the upper surface 270a of the first heat conductive layer 270 may be formed on the same plane as the upper surface of the second semiconductor chip 130.

In an exemplary embodiment of the present inventive concept, the upper surface 270a of the first heat conductive layer 270 may be formed to be lower than the upper surface 120a of the first semiconductor chip 120, and may be formed on the same plane as the upper surface of the second semiconductor chip 130. Further, in an exemplary embodiment of the present inventive concept, the upper surface 270a of the first heat conductive layer 270 may be formed on the same plane as the upper surface 120a of the first semiconductor chip 120, and may be formed to be lower than the upper surface of the second semiconductor chip 130.

Hereinafter, a semiconductor package according to an exemplary embodiment of the present inventive concept will be described with reference to FIG. 8. Differences from the semiconductor package shown in FIGS. 1 and 2 will be mainly described. In addition, to the extent that the description of various elements are omitted, it may be assumed that these elements are at least similar to corresponding elements that have already been described.

FIG. 8 is cross-sectional view illustrating a semiconductor package according to an exemplary embodiment of the present inventive concept.

Referring to FIG. 8, in the semiconductor package according to an exemplary embodiment of the present inventive concept, a first heat conductive layer 370 may cover each of the upper surface 120a of the first semiconductor chip 120 and the upper surface of the second semiconductor chip 130. For example, the upper surface 370a of the first heat conductive layer 370 may be formed to be higher than each of the upper surface 120a of the first semiconductor chip 120 and the upper surface of the second semiconductor chip 130.

Hereinafter, a semiconductor package according to an exemplary embodiment of the present inventive concept will be described with reference to FIG. 9. Differences from the semiconductor package shown in FIGS. 1 and 2 will be mainly described. In addition, to the extent that the description of various elements are omitted, it may be assumed that these elements are at least similar to corresponding elements that have already been described.

FIG. 9 is cross-sectional view illustrating the semiconductor package according to an exemplary embodiment of the present inventive concept.

Referring to FIG. 9, in the semiconductor package according to an exemplary embodiment of the present inventive concept, an upper surface 460a of an insulating layer 460 may be formed to be lower than the upper surface 110a of the interposer 110. For example, the upper surface 460a of the insulating layer 460 may be formed between the lower surface of the interposer 110 and the upper surface 110a of the interposer 110.

A first heat conductive layer 470 may be in contact with at least a part of the side walls of the interposer 110. Further, the first heat conductive layer 470 may be in contact with the upper surface 110a of the interposer 110. The upper surface 470a of the first heat conductive layer 470 may be formed to be lower than each of the upper surface 120a of the first semiconductor chip 120 and the upper surface of the second semiconductor chip 130.

Hereinafter, a semiconductor package according to an exemplary embodiment of the present inventive concept will be described with reference to FIG. 10. Differences from the semiconductor package shown in FIGS. 1 and 2 will be mainly described. In addition, to the extent that the description of various elements are omitted, it may be assumed that these elements are at least similar to corresponding elements that have already been described.

Figure 10:
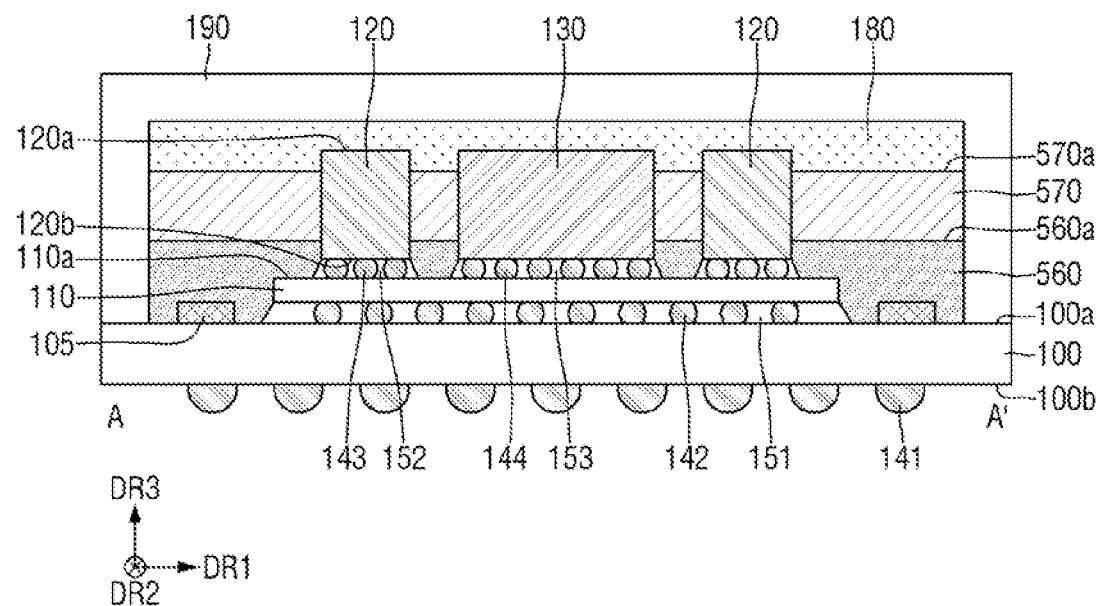
FIG. 10 is a cross-sectional view illustrating a semiconductor package according to an exemplary embodiment of the present inventive concept.

FIG. 10 is a cross-sectional view illustrating a semiconductor package according to an exemplary embodiment of the present inventive concept.

Referring to FIG. 10, in the semiconductor package according to an exemplary embodiment of the present inventive concept, an upper surface 560a of an insulating layer 560 may be formed to be higher than each of the upper surface 120a of the first semiconductor chip 120 and the upper surface of the second semiconductor chip 130.

The insulating layer 560 may at least partially surround each of a part of the side walls of the first semiconductor chip 120 and a part of the side walls of the second semiconductor chip 130. For example, the insulating layer 560 may be in contact with each of a part of the side walls of the first semiconductor chip 120 and a part of the side walls of the second semiconductor chip 130. An upper surface 570a of the first heat conductive layer 570 may be formed to be lower than each of the upper surface 120a of the first semiconductor chip 120 and the upper surface of the second semiconductor chip 130.

Hereinafter, a semiconductor package according to an exemplary embodiment of the present inventive concept will be described with reference to FIG. 11. Differences from the semiconductor package shown in FIGS. 1 and 2 will be mainly described. In addition, to the extent that the description of various elements are omitted, it may be assumed that these elements are at least similar to corresponding elements that have already been described.

Figure 11:
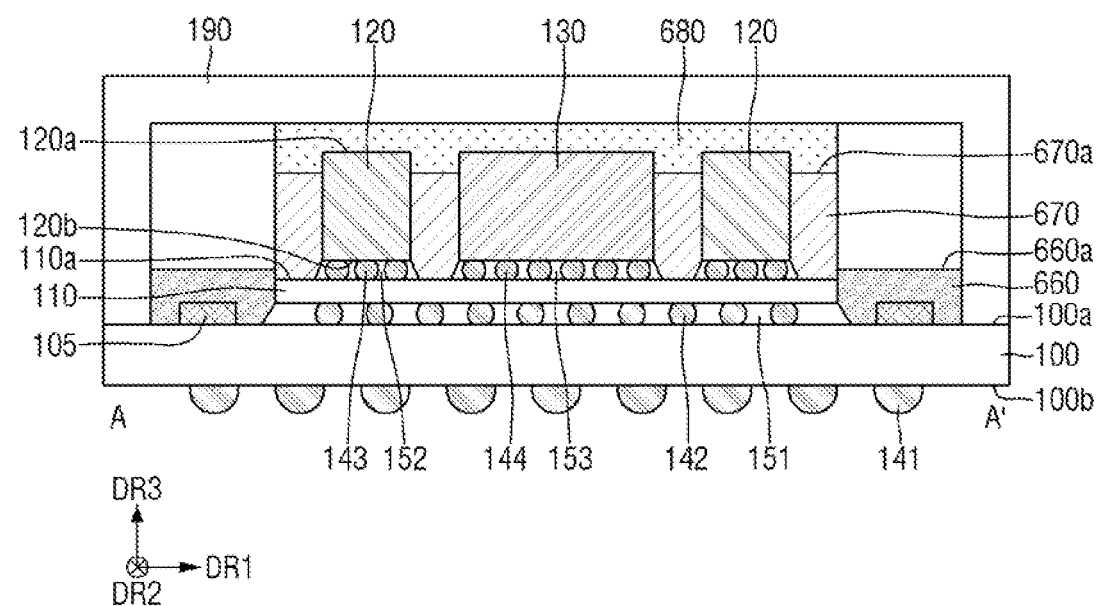
FIG. 11 is a cross-sectional view illustrating a semiconductor package according to an exemplary embodiment of the present inventive concept.

FIG. 11 is a cross-sectional view illustrating a semiconductor package according to an exemplary embodiment of the present inventive concept.

Referring to FIG. 11, in the semiconductor package according to an exemplary embodiment of the present inventive concept, side walls of a first heat conductive layer 670 and side walls of a second heat conductive layer 680 may each be spaced apart from the heat sink 19). For example, a gap may be between the side walls of the first heat conductive layer 670 and the heat sink 190, and a gap may between the side walls of the second heat conductive layer 680 and the heat sink 190.

For example, each of the side walls of the first heat conductive layer 670 and the side walls of the second heat conductive layer 680 may be aligned with the side walls of the interposer 110 in the vertical direction DR3. The first heat conductive layer 670 may cover each of the side walls of the second underfill material 152 and the side walls of the third underfill material 153 on the upper surface 110a of the interposer 110. For example, the first heat conductive layer 670 may completely surround each of the side walls of the second underfill material 152 and the side walls of the third underfill material 153 on the upper surface 110a of the interposer 110.

An upper surface 660a of an insulating layer 660 may be formed higher than the upper surface 110a of the interposer 110; however, the present inventive concept is not limited thereto. The upper surface 660a of the insulating layer 660 may be formed to be higher than the lower surface of the first heat conductive layer 670. For example, the insulating layer 660 may be in contact with a part of the side walls of the first heat conductive layer 670. The upper surface 670a of the first heat conductive layer 670 may be formed to be lower than each of the upper surface 120a of the first semiconductor chip 120 and the upper surface of the second semiconductor chip 130. However, the present inventive concept is not limited thereto. For example, the upper surface 670a of the first heat conductive layer 670 may be on the same plane as that of the upper surface 120a of the first semiconductor chip 120 or may be higher than the upper surface 120a of the first semiconductor chip 120.

Hereinafter, a method for fabricating a semiconductor package according to an exemplary embodiment of the present inventive concept will be described with reference to FIGS. 11 to 15.

FIGS. 12 to 15 are intermediate stage diagrams illustrating a method for fabricating a semiconductor package according to an exemplary embodiment of the present inventive concept.

Figure 12:
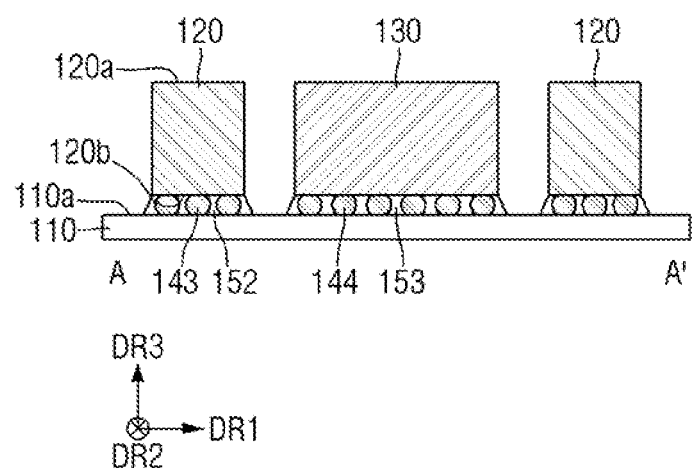
FIGS. 12, 13, 14 and 15 are intermediate stage diagrams illustrating a method for fabricating a semiconductor package according to an exemplary embodiment of the present inventive concept.

Referring to FIG. 12, the first semiconductor chip 120 and the second semiconductor chip 130 may be formed on the upper surface 110a of the interposer 110. The first semiconductor chip 120 may be connected to the upper surface 110a of the interposer 110 through the third solder ball 143. Further, the second semiconductor chip 130 may be connected to the upper surface 110a of the interposer 110 through the fourth solder ball 144.

Next, the second underfill material 152 may be formed to surround the side walls of the third solder ball 143 and may be disposed between the upper surface 110a of the interposer 110 and the first semiconductor chip 120. Further, the third underfill material 153 may be formed to surround the side walls of the fourth solder ball 144 and may be disposed between the upper surface 100a of the interposer 110 and the second semiconductor chip 130.

Figure 13:
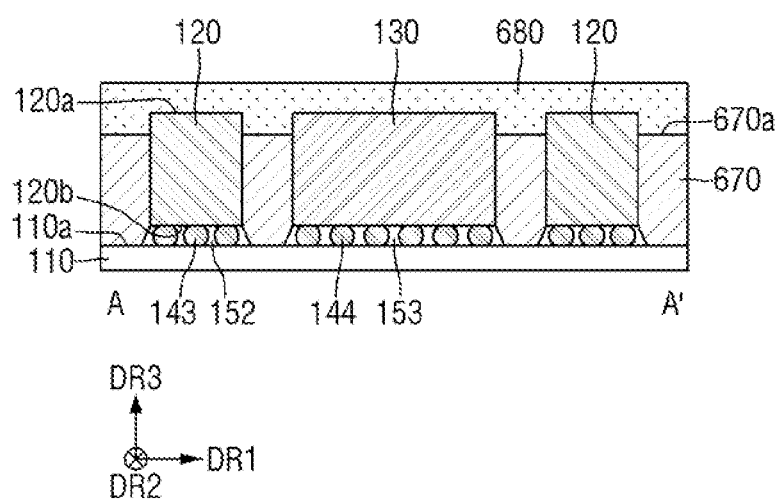

Referring to FIG. 13, the first heat conductive layer 670 may be formed on the interposer 110. For example, the first heat conductive layer 670 may be formed on the upper surface 110a of the interposer 110. The first heat conductive layer 670 may at least partially surround each of a part of the side walls of the first semiconductor chip 120 and a part of the side walls of the second semiconductor chip 130. For example, the first heat conductive layer 670 may be in contact with each of a part of the side walls of the first semiconductor chip 120 and a part of the side walls of the second semiconductor chip 130. For example, the upper surface 670a of the first heat conductive layer 670 may be formed to be lower than each of the upper surface 120a of the first semiconductor chip 120 and the upper surface of the second semiconductor chip 130.

Subsequently, the second heat conductive layer 680 may be formed on the first heat conductive layer 670. For example, the second heat conductive layer 680 may be formed on the upper surface 670a of the first heat conductive layer 670. The second heat conductive layer 680 may at least partially surround each of a part of the side walls of the first semiconductor chip 120 and a part of the side walls of the second semiconductor chip 130. Further, the second heat conductive layer 680 may cover each of the upper surface 120a of the first semiconductor chip 120 and the upper surface of the second semiconductor chip 130.

Figure 14:
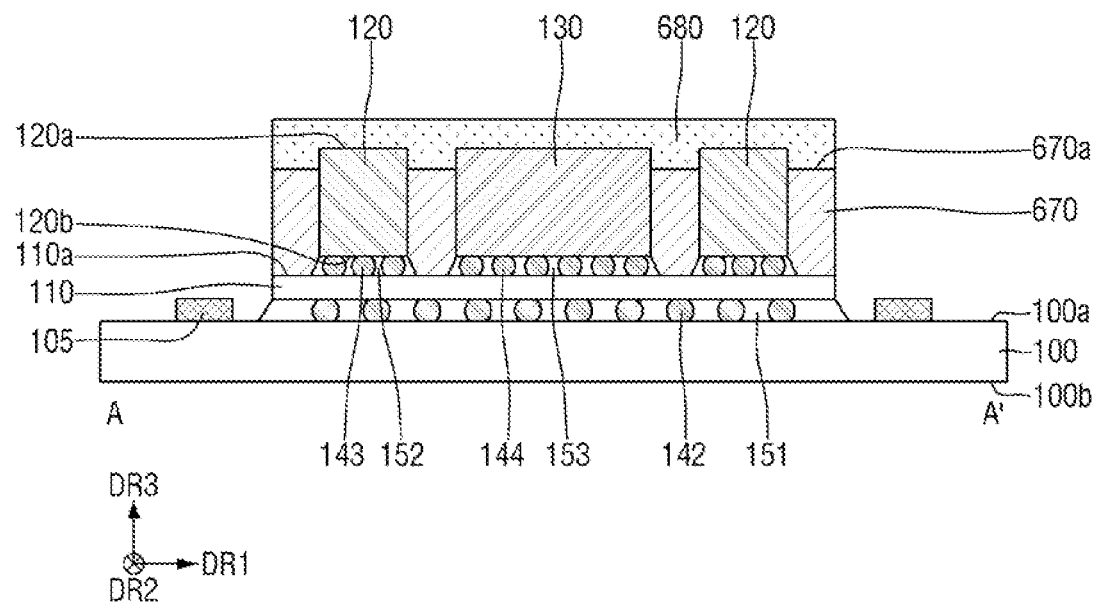

Referring to FIG. 14, the interposer 110 may be attached to the substrate 100. For example, the interposer 110 may be attached to the upper surface 100a of the substrate 100. The lower surface of the interposer 110 may be connected to the upper surface 100a of the substrate 100 through the second solder ball 142. Subsequently, the first underfill material 151 may be formed to surround the side walls of the second solder ball 142 and may be disposed between the upper surface 100a of the substrate 100 and the interposer 110. Subsequently, a plurality of capacitors 105 may be formed on the edge of the upper surface 100a of the substrate 100. The plurality of capacitors 105 may be spaced apart from the first underfill material 151.

In an exemplary embodiment of the present inventive concept, after a plurality of capacitors 105 are formed on the edge of the upper surface 100a of the substrate 100, the interposer 110 may be attached to the upper surface 100a of the substrate 100.

Figure 15:
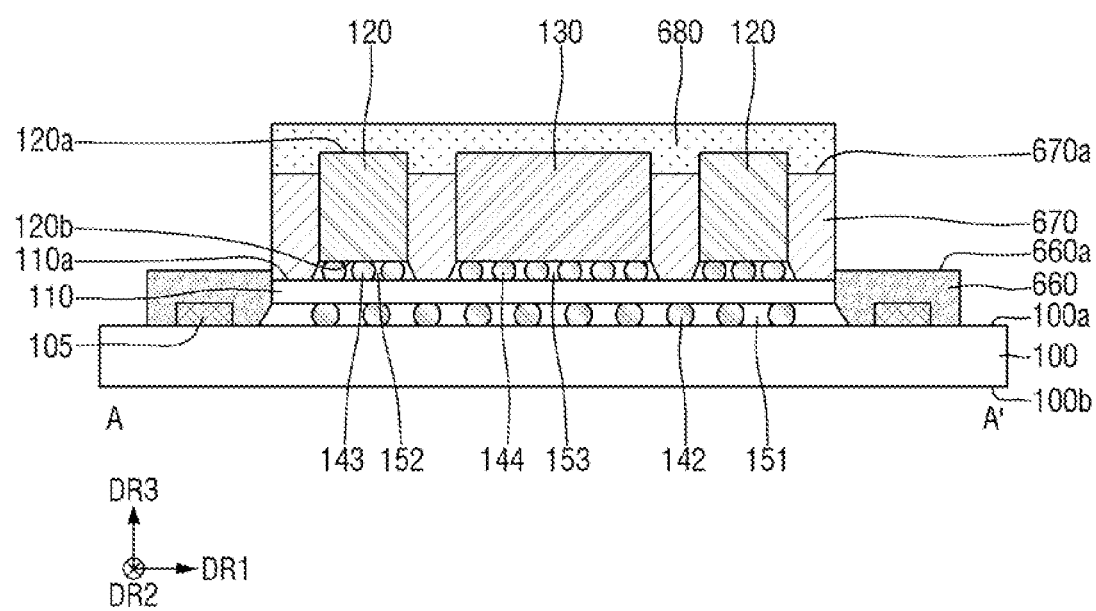

Referring to FIG. 15, an insulating layer 660 may be formed to cover the plurality of capacitors 105 on the upper surface 100a of the substrate 100. For example, the insulating layer 660 may be disposed between the plurality of capacitors 105 and the first underfill material 151. For example, an upper surface 660a of the insulating layer 660 may be formed to be higher than the upper surface 110a of the interposer 110. Further, for example, the upper surface 660a of the insulating layer 660 may be formed to be lower than each of the lower surface 120b of the first semiconductor chip 120 and the lower surface of the second semiconductor chip 130. The insulating layer 660 may be in contact with each of the side walls of the interposer 110 and a part of the side walls of the first heat conductive layer 670.

Referring to FIG. 11, the heat sink 190 may be formed on the upper surface 100a of the substrate 100. The heat sink 190 may cover each of the insulating layer 660, the first heat conductive layer 670, and the second heat conductive layer 680. For example, the heat sink 190 may be in contact with each of the upper surface 100a of the substrate 100, the side walls of the insulating layer 660, and the upper surface of the second heat conductive layer 680. The heat sink 190 may be spaced apart from each of the side walls of the first heat conductive layer 670 and the side walls of the second heat conductive layer 680. For example, the heat sink 190 may also be spaced apart from the upper surface of the first heat conductive layer 670. The semiconductor package shown in FIG. 11 may be fabricated through such a fabricating process.

Hereinafter, a semiconductor package according to an exemplary embodiment of the present inventive concept will be described with reference to FIGS. 16 and 17. Differences from the semiconductor package shown in FIGS. 1 and 2 will be mainly described. In addition, to the extent that the description of various elements are omitted, it may be assumed that these elements are at least similar to corresponding elements that have already been described.

FIG. 16 is a plan view illustrating a semiconductor package according to an exemplary embodiment of the present inventive concept. FIG. 17 is a cross-sectional view taken along the line B-B' of FIG. 16.

Figure 17:
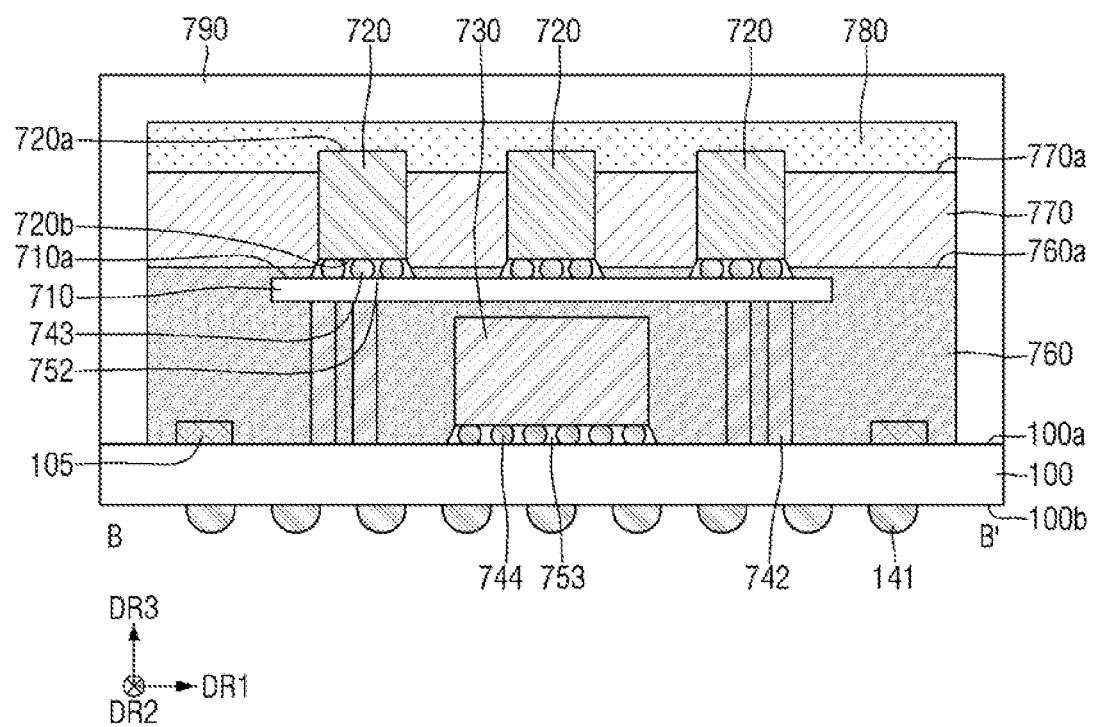
FIG. 17 is a cross-sectional view taken along a line B-B' of FIG. 16.

Referring to FIGS. 16 and 17, the semiconductor package according to an exemplary embodiment of the present inventive concept includes a substrate 100, a capacitor 105, an interposer 710, a first semiconductor chip 720, a second semiconductor chip 730, a first solder ball 141, a connecting via 742, a third solder ball 743, a fourth solder ball 744, a second underfill material 752, a third underfill material 753, an insulating layer 760, a first heat conductive layer 770, a second heat conductive layer 780, and a heat sink 790.

The interposer 710 may be disposed on the upper surface 100a of the substrate 100. The connecting via 742 may be disposed between the upper surface 100a of the substrate 100 and the interposer 710. The connecting via 742 may extend in the vertical direction DR3. The connecting via 742 may be in contact with the conductive terminal disposed on the upper surface 100a of the substrate 100. The connecting via 742 may be in contact with a conductive terminal disposed on the lower surface of the interposer 710. The interposer 710 may be electrically connected to the substrate 100 through the connecting via 742.

The second semiconductor chip 730 may be disposed between the upper surface 100a of the substrate 100 and the interposer 710. The second semiconductor chip 730 may be, for example, a logic semiconductor chip. The second semiconductor chip 730 may be, for example, a micro-processor. The second semiconductor chip 730 may be, for example, a central processing unit (CPU), a controller, an application specific integrated circuit (ASIC), or the like.

The fourth solder ball 744 may be disposed between the upper surface 100a of the substrate 100 and the second semiconductor chip 730. The second semiconductor chip 730 may be electrically connected to the substrate 100 through the fourth solder ball 744. The third underfill material 753 may be disposed to at least partially surround the side walls of the fourth solder ball 744 and may be between the upper surface 100a of the substrate 100 and the second semiconductor chip 730.

The first semiconductor chip 720 may be disposed on the upper surface 710a of the interposer 710. Although FIG. 16 shows that six first semiconductor chips 720 are disposed on the upper surface 710a of the interposer 710, the number of first semiconductor chips 720 disposed on the upper surface 710a of the interposer 710 is not limited thereto. For example, the first semiconductor chip 720 may be an HBM semiconductor package. For example, the first semiconductor chip 720 may include a plurality of stacked memory semiconductor chips.

The third solder ball 743 may be disposed between the upper surface 710a of the interposer 710 and the first semiconductor chip 720. The first semiconductor chip 720 may be electrically connected to the interposer 710 through the third solder ball 743. The second underfill material 752 may be disposed to around the side walls of the third solder ball 743 and may be between the upper surface 710a of the interposer 710 and the first semiconductor chip 720.

The insulating layer 760 may be disposed on the upper surface 100a of the substrate 100. The insulating layer 760 may cover the capacitor 105. The insulating layer 760 may cover the side walls and the upper surface of the second semiconductor chip 730. The insulating layer 760 may surround the side walls of the connecting via 742. An upper surface 760a of the insulating layer 760 may be formed to be higher than the upper surface 710a of the interposer 710. The upper surface 760a of the insulating layer 760 may be formed to be lower than the lower surface 720b of the first semiconductor chip 720.

The first heat conductive layer 770 may be disposed on the insulating layer 760. The first heat conductive layer 770 may surround the side walls of the first semiconductor chip 720. The first heat conductive layer 770 may be disposed on the side walls of the first semiconductor chip 720. For example, the first heat conductive layer 770 may be in contact with the side walls of the first semiconductor chip 720. The first heat conductive layer 770 may be electrically insulated from the capacitor 105. For example, the insulating layer 760 may be disposed between the capacitor 105 and the first heat conductive layer 770.

A lower surface of the first heat conductive layer 770 may be formed to be higher than the upper surface 710a of the interposer 710. The lower surface of the first heat conductive layer 770 may be formed to be lower than the lower surface 720b of the first semiconductor chip 720. An upper surface 770a of the first heat conductive layer 770 may be formed to be lower than the upper surface 720a of the first semiconductor chip 720.

The second heat conductive layer 780 may be disposed on the first heat conductive layer 770. The second heat conductive layer 780 may surround the side walls and the upper surface 720a of the first semiconductor chip 720. For example, the second heat conductive layer 780 may be in contact with the first heat conductive layer 770. The second heat conductive layer 780 may be disposed on each of the side walls and the upper surface 720a of the first semiconductor chip 720. For example, the second heat conductive layer 780 may be in contact with each of the side walls and the upper surface 720a of the first semiconductor chip 720. The lower surface of the second heat conductive layer 780 may be formed to be lower than the upper surface 720a of the first semiconductor chip 720. The upper surface of the second heat conductive layer 780 may be formed to be higher than the upper surface 720a of the first semiconductor chip 720.

The heat sink 790 may be disposed on the upper surface 100a of the substrate 100. The heat sink 790 may be disposed to cover each of the insulating layer 760, the first heat conductive layer 770, and the second heat conductive layer 780. For example, the heat sink 790 may be in contact with the upper surface 100a of the substrate 100, the side walls of the insulating layer 760, the side walls of the first heat conductive layer 770, and the side walls and the upper surface of the second heat conductive layer 780.

Hereinafter, a semiconductor package according to an exemplary embodiment of the present inventive concept will be described with reference to FIGS. 18 and 19. Differences from the semiconductor package shown in FIGS. 1 and 2 will be mainly described. In addition, to the extent that the description of various elements are omitted, it may be assumed that these elements are at least similar to corresponding elements that have already been described.

Figure 18:
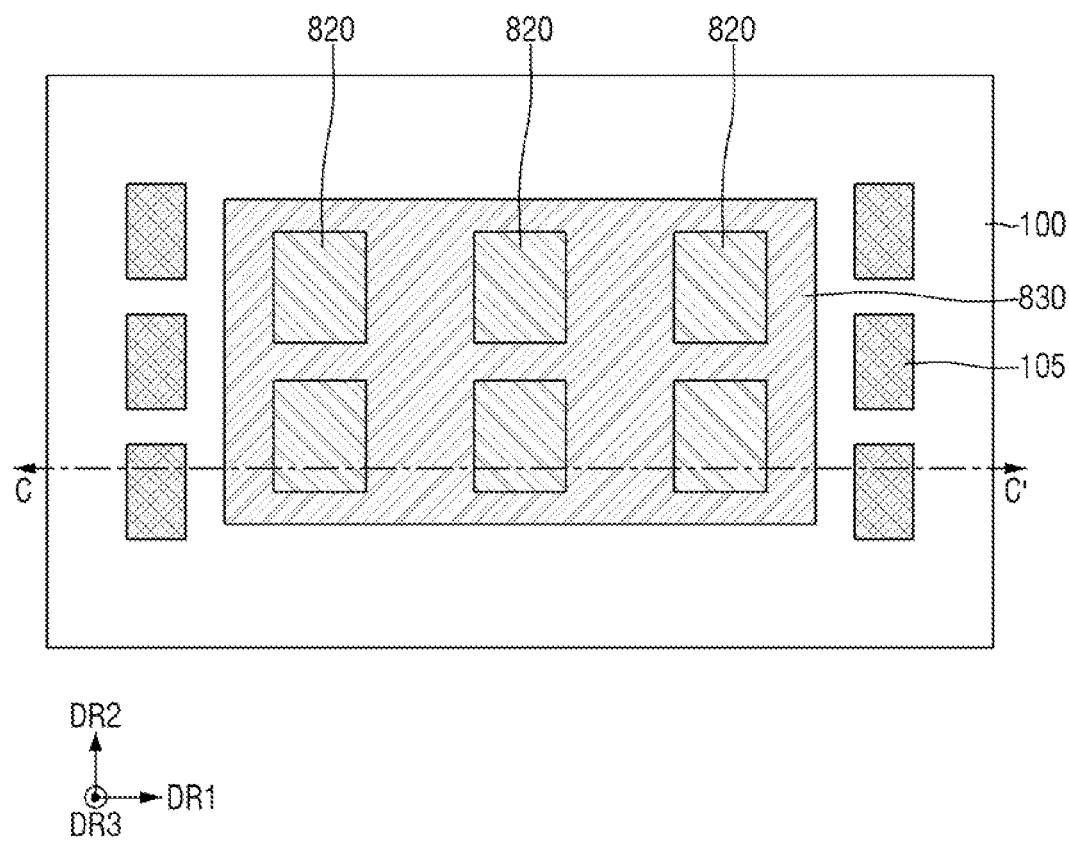
FIG. 18 is a plan view illustrating a semiconductor package according to an exemplary embodiment of the present inventive concept.

FIG. 18 is a plan view illustrating a semiconductor package according to an exemplary embodiment of the present inventive concept. FIG. 19 is a cross-sectional view taken along the line C-C' of FIG. 18.

Figure 19:
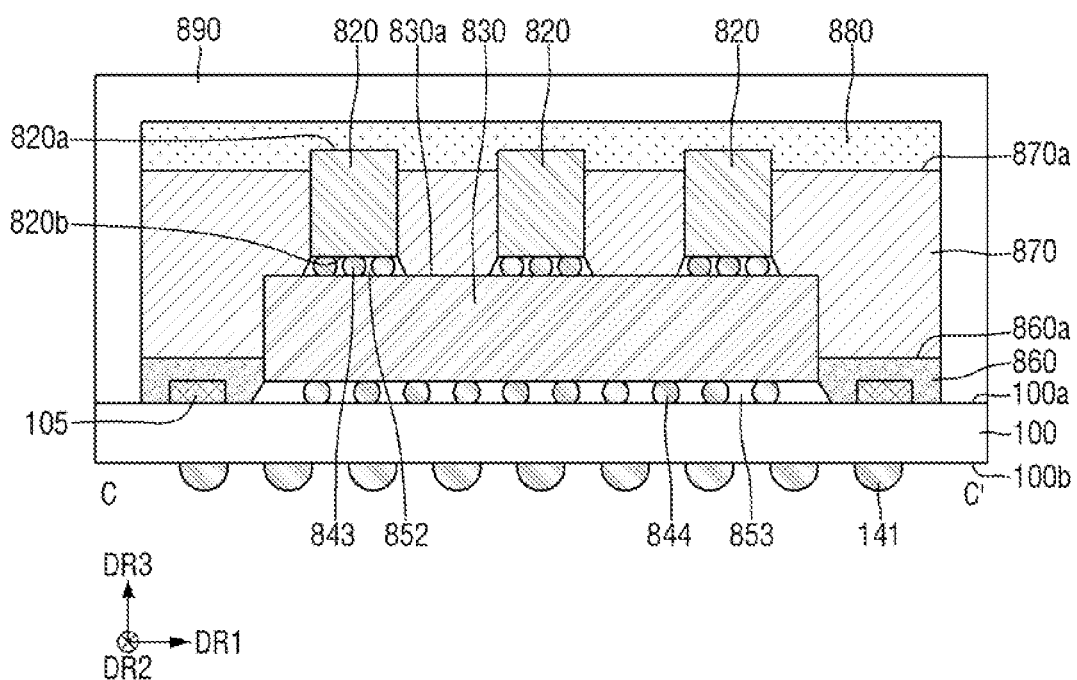
FIG. 19 is a cross-sectional view taken along a line C-C' of FIG. 18.

Referring to FIGS. 18 and 19, the semiconductor package according to an exemplary embodiment of the present inventive concept includes a substrate 100, a capacitor 105, a first semiconductor chip 820, a second semiconductor chip 830, a first solder ball 141, a third solder ball 843, a fourth solder ball 844, a second underfill material 852, a third underfill material 853, an insulating layer 860, a first heat conductive layer 870, a second heat conductive layer 880, and a heat sink 890.

The second semiconductor chip 830 may be disposed on the upper surface 100a of the substrate 100. The second semiconductor chip 830 may be, for example, a logic semiconductor chip. The second semiconductor chip 830 may be, for example, a micro-processor. The second semiconductor chip 830 may be, for example, a central processing unit (CPU), a controller, an application specific integrated circuit (ASIC) or the like.

The fourth solder ball 844 may be disposed between the upper surface 100a of the substrate 100 and the second semiconductor chip 830. The second semiconductor chip 830 may be electrically connected to the substrate 100 through the fourth solder ball 844. The third underfill material 853 may be disposed on the side walls of the fourth solder ball 844 and may be disposed between the upper surface 100a of the substrate 100 and the second semiconductor chip 830.

The first semiconductor chip 820 may be disposed on the upper surface 830a of the second semiconductor chip 830. Although FIG. 18 shows that six first semiconductor chips 820 are disposed on the upper surface 830a of the second semiconductor chip 830, the number of first semiconductor chips 820 disposed on the upper surface 830a of the second semiconductor chip 830 is not limited thereto. For example, the first semiconductor chip 820 may be an HBM semiconductor package. For example, the first semiconductor chip 820 may include a plurality of stacked memory semiconductor chips.

The third solder ball 843 may be disposed between the upper surface 830a of the second semiconductor chip 830 and the first semiconductor chip 820. The first semiconductor chip 820 may be electrically connected to the second semiconductor chip 830 through the third solder ball 843. The second underfill material 852 may be disposed on the side walls of the third solder ball 843 and may be disposed between the upper surface 830a of the second semiconductor chip 830 and the first semiconductor chip 820.

The insulating layer 860 may be disposed on the upper surface 100a of the substrate 100. The insulating layer 860 may cover the capacitor 105. The insulating layer 860 may surround a part of the side walls of the second semiconductor chip 830. An upper surface 860a of the insulating layer 860 may be formed to be higher than the lower surface of the second semiconductor chip 830. The upper surface 860a of the insulating layer 860 may be formed to be lower than the upper surface 830a of the second semiconductor chip 830.

The first heat conductive layer 870 may be disposed on the insulating layer 860. The first heat conductive layer 870 may surround the side walls of the second semiconductor chip 830. The first heat conductive layer 870 may be disposed on the side walls of the second semiconductor chip 830. For example, the first heat conductive layer 870 may be in contact with the side walls of the second semiconductor chip 830. The first heat conductive layer 870 may surround the side walls of the first semiconductor chip 820. The first heat conductive layer 870 may be disposed on the side walls of the first semiconductor chip 820. For example, the first heat conductive layer 870 may be in contact with the side walls of the first semiconductor chip 820. The first heat conductive layer 870 may be electrically insulated from the capacitor 105.

The lower surface of the first heat conductive layer 870 may be formed to be higher than the lower surface of the second semiconductor chip 830. The lower surface of the first heat conductive layer 870 may be formed to be lower than the lower surface 820b of the first semiconductor chip 820. The lower surface of the first heat conductive layer 870 may be formed to be lower than the upper surface 830a of the second semiconductor chip 830. An upper surface 870a of the first heat conductive layer 870 may be formed to be lower than the upper surface 820a of the first semiconductor chip 820.

The second heat conductive layer 880 may be disposed on the first heat conductive layer 870. The second heat conductive layer 880 may surround the side walls and the upper surface 820a of the first semiconductor chip 820. For example, the second heat conductive layer 880 may be in contact with the first heat conductive layer 870. The second heat conductive layer 880 may be disposed on each of the side walls and the upper surface 820a of the first semiconductor chip 820. For example, the second heat conductive layer 880 may be in contact with each of the side walls and the upper surface 820a of the first semiconductor chip 820. The lower surface of the second heat conductive layer 880 may be formed to be lower than the upper surface 820a of the first semiconductor chip 820. The upper surface of the second heat conductive layer 880 may be formed to be higher than the upper surface 820*a* of the first semiconductor chip 820.

The heat sink 890 may be disposed on the upper surface 100*a* of the substrate 100. The heat sink 890 may be disposed to cover each of the insulating layer 860, the first heat conductive layer 870, and the second heat conductive layer 880. For example, the heat sink 890 may be in contact with each of the upper surface 100*a* of the substrate 100, the side walls of the insulating layer 860, the side walls of the first heat conductive layer 870, the side walls and the upper surface 830*a* of the second heat conductive layer 880.

According to an exemplary embodiment of the present inventive concept, a semiconductor package may effectively release heat generated from a semiconductor chip to the outside of the semiconductor package, by disposing a lower heat conductive layer, which includes a conductive material having high thermal conductivity, to be in contact with side walls of the semiconductor chip and to surround the side walls of the semiconductor chip.

According to an exemplary embodiment of the present inventive concept, a semiconductor package may prevent a heat sink from being peeled off from an upper heat conductive layer, by disposing the upper heat conductive layer, which includes a non-conductive material having a relatively high Young's modulus and an elongation, on a lower heat conductive layer.

While the present inventive concept has been described with reference to exemplary embodiments thereof, it will be understood by those of ordinary skill in the art that various changes in form and details may be made thereto without departing from the spirit and scope of the present inventive concept.

What is claimed is:

1. A semiconductor package comprising:
a substrate;
a first semiconductor chip disposed on the substrate;
a capacitor disposed on the substrate and spaced apart from the first semiconductor chip in a first direction;
an insulating layer disposed on the substrate and covering the capacitor;
a first heat conductive layer at least partially surrounding side walls of the first semiconductor chip and disposed on the insulating layer, wherein the first heat conductive layer is in contact with the side walls of the first semiconductor chip, and wherein the first heat conductive layer includes a first material that is a conductive material; and
a second heat conductive layer disposed on the first heat conductive layer, wherein the second heat conductive layer is in contact with the first heat conductive layer, wherein the second heat conductive layer includes a second material that is a non-conductive material.

2. The semiconductor package of claim 1, wherein a thermal conductivity of the first material is greater than a thermal conductivity of the second material.

3. The semiconductor package of claim 1, wherein a Young's modulus of the first material is smaller than a Young's modulus of the second material.

4. The semiconductor package of claim 1, wherein an elongation of the first material is smaller than an elongation of the second material.

5. The semiconductor package of claim 1, wherein an upper surface of the insulating layer is higher than an upper surface of the capacitor, with respect to an upper surface of the substrate.

6. The semiconductor package of claim 1, further comprising:
an interposer disposed between the substrate and the first semiconductor chip, wherein the interposer is electrically connected to each of the substrate and the first semiconductor chip.

7. The semiconductor package of claim 6, further comprising:
A second semiconductor chip disposed on the interposer and spaced apart from the first semiconductor chip in the first direction, wherein the second semiconductor chip is electrically connected to the interposer, and wherein the first heat conductive layer at least partially surrounds side walls of the second semiconductor chip.

8. The semiconductor package of claim 6, further comprising:
A second semiconductor chip disposed between the substrate and the interposer, wherein the second semiconductor chip is electrically connected to the substrate, and wherein the insulating layer at least partially surrounds side walls of the second semiconductor chip.

9. The semiconductor package of claim 1, wherein an upper surface of the first heat conductive layer is formed to be lower than an upper surface of the first semiconductor chip, with respect to an upper surface of the substrate.

10. The semiconductor package of claim 1, wherein an upper surface of the insulating layer is formed to be lower than a lower surface of the first semiconductor chip, with respect to an upper surface of the substrate.

11. The semiconductor package of claim 1, further comprising:
a heat sink covering the insulating layer, the first heat conductive layer and the second heat conductive layer.

12. The semiconductor package of claim 11, wherein side walls of the first heat conductive layer are in contact with the heat sink.

13. The semiconductor package of claim 11, wherein side walls of the first heat conductive layer are spaced apart from the heat sink.

14. A semiconductor package comprising:
a substrate;
an interposer disposed on the substrate;
a first semiconductor chip disposed on the interposer, and electrically connected to the interposer;
an insulating layer disposed on the substrate, in contact with at least parts of side walls of the interposer;
a first heat conductive layer surrounding side walls of the first semiconductor chip and disposed on the insulating layer, wherein the first heat conductive layer is in contact with the side walls of the first semiconductor chip, wherein the first heat conductive layer includes a first material that is a conductive material, and wherein a lower surface of the first heat conductive layer is formed to be lower than a lower surface of the first semiconductor chip, with respect to an upper surface of the substrate; and
a second heat conductive layer disposed on the first heat conductive layer, and in contact with each of the first heat conductive layer and the first semiconductor chip, and wherein the second heat conductive layer includes a second material that is a non-conductive material.

15. The semiconductor package of claim 14, further comprising:
a capacitor disposed on the substrate and spaced apart from the interposer in a horizontal direction, wherein the capacitor is spaced apart from the first heat conductive layer in a vertical direction, and is surrounded by the insulating layer.

16. The semiconductor package of claim 14, further comprising:
a second semiconductor chip disposed on an upper surface of the interposer and spaced apart from the first semiconductor chip in a horizontal direction, wherein the second semiconductor chip is electrically connected to the interposer, and side walls of second semiconductor chip are surrounded by the first heat conductive layer.

17. The semiconductor package of claim 14, wherein an upper surface of the first heat conductive layer is formed to be lower than an upper surface of the first semiconductor chip, with respect to the upper surface of the substrate.

18. The semiconductor package of claim 14, wherein the first heat conductive layer covers an upper surface of the first semiconductor chip.

19. The semiconductor package of claim 14, further comprising:
a second semiconductor chip disposed between the substrate and the first semiconductor chip, wherein the second semiconductor chip is electrically connected to each of the substrate and the first semiconductor chip.

20. A semiconductor package comprising:
a substrate;
an interposer disposed on the substrate;
a first semiconductor chip disposed on the interposer, and electrically connected to the interposer;
a second semiconductor chip disposed on the interposer and spaced apart from the first semiconductor chip in a horizontal direction, wherein the second semiconductor chip is electrically connected to the interposer;
a capacitor disposed on the substrate and spaced apart from the interposer in the horizontal direction;
an insulating layer covering the capacitor;
a first heat conductive layer disposed on the insulating layer and surrounding side walls of the first semiconductor chip, wherein the first heat conductive layer is in contact with the side walls of the first semiconductor chip, wherein the first heat conductive layer includes a first material that is a conductive material, and wherein a lower surface of the first heat conductive layer is lower than a lower surface of the first semiconductor chip, with respect to an upper surface of the substrate;
a second heat conductive layer disposed on the first heat conductive layer, and in contact with each of the first heat conductive layer, the first semiconductor chip and the second semiconductor chip, and wherein the second heat conductive layer includes a second material that is a non-conductive material; and
a heat sink covering the insulating layer, the first heat conductive layer, and the second heat conductive layer, wherein the heat sink is in contact with side walls of the first heat conductive layer, and
wherein a thermal conductivity of the first material is greater than a thermal conductivity of the second material.

* * * * *